United States Patent
Boesch et al.

[11] Patent Number: 5,864,493
[45] Date of Patent: Jan. 26, 1999

[54] SELF-ADAPTING INTERVAL MEAN VALUE FILTER

[75] Inventors: Mathew Alan Boesch, Plymouth; Douglas Scott Rhode, Farmington Hills, both of Mich.

[73] Assignee: Ford Global Technologies, Inc., Dearborn, Mich.

[21] Appl. No.: 873,432

[22] Filed: Jun. 12, 1997

[51] Int. Cl.$^6$ .................................................. G06F 17/00
[52] U.S. Cl. ..................................... 364/724.11; 364/734
[58] Field of Search ........................ 364/715.013, 715.06, 364/724.014, 728.02, 734, 724.1, 724.19; 702/190–197, 23, 724.011; 348/625

[56] References Cited

U.S. PATENT DOCUMENTS

| | | | |
|---|---|---|---|
| 4,363,138 | 12/1982 | Franklin et al. | 455/226 |
| 4,816,752 | 3/1989 | Michalski et al. | 324/130 |
| 4,942,546 | 7/1990 | Rambaut | 364/574 |
| 5,138,567 | 8/1992 | Mehrgardt | 364/724.01 |
| 5,144,568 | 9/1992 | Glover | 364/715.01 |
| 5,319,450 | 6/1994 | Tamayama et al. | 348/692 |
| 5,327,078 | 7/1994 | Mori | 324/207.24 |
| 5,412,432 | 5/1995 | Hong | 348/625 |
| 5,426,670 | 6/1995 | Leppanen et al. | 364/724.11 X |
| 5,708,595 | 1/1998 | Connell | 364/715.01 |

Primary Examiner—Ayaz R. Sheikh
Assistant Examiner—Douglas S. Lee
Attorney, Agent, or Firm—Paul K. Godwin; Roger L. May

[57] ABSTRACT

A sensing method and system for generating an output signal indicative of an estimated mean value of an input signal is provided. A sensor samples the input signal for N (N=2, 4, 8, 16, . . . ) input signal samples and determines a current twice mean value of the N input signal samples. The current twice mean value is equal to one-half of the summation of two terms, the first being twice the mean value of the first N/2 input signal samples (called the previous twice mean value) and the second being twice the mean value of the last N/2 input signal samples. The sensor then compares the current twice mean value to a previous twice mean value. The sensor then stores the current twice mean value as the previous twice mean value, increments N by a power of two, samples the input signal sample for the next N/2 input signal samples, determines the current twice mean value of the incremented N input signal samples, and compares the current twice mean value to the previous twice mean value until the current twice mean value is within a predetermined tolerance of the previous twice mean value a consecutive number of times. The sensor then generates an output signal indicative of an estimate of the mean value of the input signal. The estimated mean value is one-half of the current twice mean value.

6 Claims, 4 Drawing Sheets

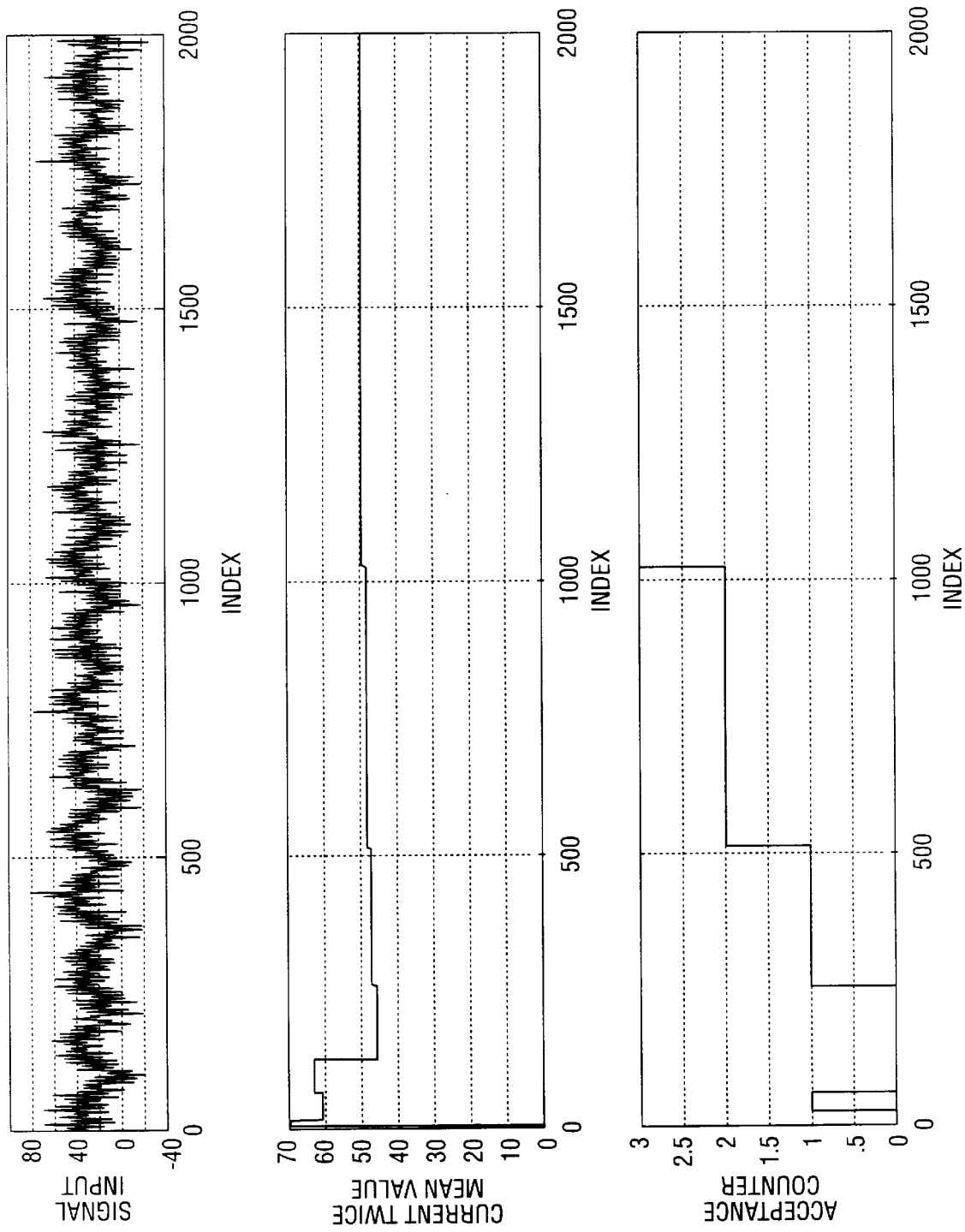

SELF-ADAPTING INTERVAL MEAN VALUE FILTER

TECHNICAL FIELD

The present invention relates to signal filtering and, more particularly, to filters for generating the mean value of a signal.

BACKGROUND ART

A mean value filter outputs a signal indicative of the mean value of an input signal. A proper mean value filter determines an unbiased estimate of the mean value of the input signal. An unbiased estimate is obtained when samples of the input signal are weighted equally. Mean value filters are used in a variety of applications such as bias washout, digital filter initialization, and diagnostic testing.

Bias Washout

In computerized real-time control systems, sensors provide an outputted sensor signal indicative of a sensed parameter to a controller such as a computer. Typically, the sensor signal is made up of two components. The first component is responsive to the sensed parameter. The second component is an unknown steady-state value referred to as bias. The bias component is a baseline or static value. To obtain a proper reading on the sensed parameter, the bias component must be subtracted from the sensor signal. Subtracting the bias component is referred to as DC or static value washout. For proper washout, an accurate estimate of the mean value of the bias is needed to be determined.

Digital Filter Initialization

Electronic controllers typically use digital filters for conditioning of inputted sensor signals. A digital filter analyzes discrete samples of a sensor signal. The settling time of a digital filter is minimized upon start up if the initial condition of the filter is set to the present value of the sensor signal. Due to the settling time of external filters and the possibility of electrical noise on the sensor signal, a single sample of the signal may produce a biased initial condition for the digital filter. This problem can be remedied with an unbiased estimate of the mean value of the sensor signal. Unbiased mean value estimates provide the best initial condition for digital filters.

Diagnostic Tests

The progressive deterioration of parts, such as automotive parts, may be identified by a persistent shift in the mean value of a sensor signal. While the mean value of the sensor signal is indicative of deterioration, the actual sensor signal may have superimposed on the mean value other components. For instance, with automotive parts, the other components may be related to the present vehicle operating point (i.e., accelerating, braking, turning, surface conditions, etc.) or caused by other noise sources. An unbiased estimate of the mean value of the sensor signal which filters off the operating point related components is necessary for sensing mean value shifts for proper diagnostic testing.

Conventional approaches for estimating the mean value of a real-time signal include low pass (continuous offset estimating) filters, fixed size interval batch averaging; and comparison testing of contiguous batch averages. Low pass filters continuously update an approximation of the mean value, but place more emphasis on historically recent data. In diagnostic applications, placing a greater emphasis on historically recent data is undesirable because faults are detectable only as slow shifts in the mean value of a signal. Furthermore, to approximate a long term average, a low pass filter must have an extremely low frequency pole. The low frequency pole prolongs the settling time of the filter thereby delaying the response of the diagnostic systems.

With fixed interval batch averaging, a short interval of data may provide a biased estimate of the mean value of a signal if the variance of the samples of the signal is large. A long interval of data may provide an unbiased estimate of the mean value, but unnecessarily delays the estimation when the variance of the samples is small.

A disadvantage with comparison testing of contiguous batch averages is that agreement of mean values of neighboring batch average intervals is not sufficient to guarantee that each mean value provides an unbiased mean value estimate. Additionally, in the search for contiguous batch averages whose mean values agree, historical data is forgotten rather than used for increasing the accuracy of the mean value estimation.

Disclosure Of The Invention

A general object of the present invention is to provide a method and system for generating the mean value of a signal such that a minimum signal sample size is analyzed if the sample variance is small and a larger signal sample size is analyzed if the sample variance is large.

In carrying out the above object and other objects, features, and advantages of the present invention, a method for use with a sensor for generating an output signal indicative of an estimated mean value of an input signal is disclosed.

The method includes repeating the following until a current twice mean value is within a predetermined tolerance of a previous twice mean value a consecutive number of times. First, the input signal is sampled for N (N=2, 4, 8, 16, . . . ) input signal samples. A current twice mean value of the N input signal samples is then determined. The current twice mean value is equal to one-half of the summation of two terms, the first being twice the mean value of the first N/2 input signal samples (called the previous twice mean value) and the second being twice the mean value of the last N/2 input signal samples. The current twice mean value is then compared to the previous twice mean value to determine if the current twice mean value is within a predetermined tolerance of the previous twice mean value. The current twice mean value is then stored as the previous twice mean value. The N input signal sample variable is then incremented by a power of two.

An estimate of the mean value of the input signal is generated when the current twice mean value is within a predetermined tolerance of the previous twice mean value a consecutive number of times. The estimate of the mean value is one-half of the current twice mean value.

The present invention includes a number of attendant advantages. The mean value filtering system and method iteratively extends the sample data averaging interval size until a designated consistency is found between consecutive mean estimates. This is advantageous because for inputs which have a small variance the mean value is quickly determined. For inputs which have a large variance more samples are automatically used to determine the mean value.

The above object and other objects, features, and advantages of the present invention, as well as others, are readily apparent from the following detailed description of the best mode for carrying out the invention when taken in connection with the accompanying drawings.

BRIEF DESCRIPTION OF THE DRAWINGS

FIG. 4a is a plot of an illustrative input signal;

FIG. 4b is a plot of the twice mean values of the input signal shown in FIG. 4a;

FIG. 4d is a plot indicating the estimated mean value of the input signal;

FIG. 4e is a plot indicating that successive updates of the twice mean values are within a predetermined tolerance after the estimated mean value of the input signal has been determined.

BEST MODE(S) FOR CARRYING OUT THE INVENTION

Figure 1:
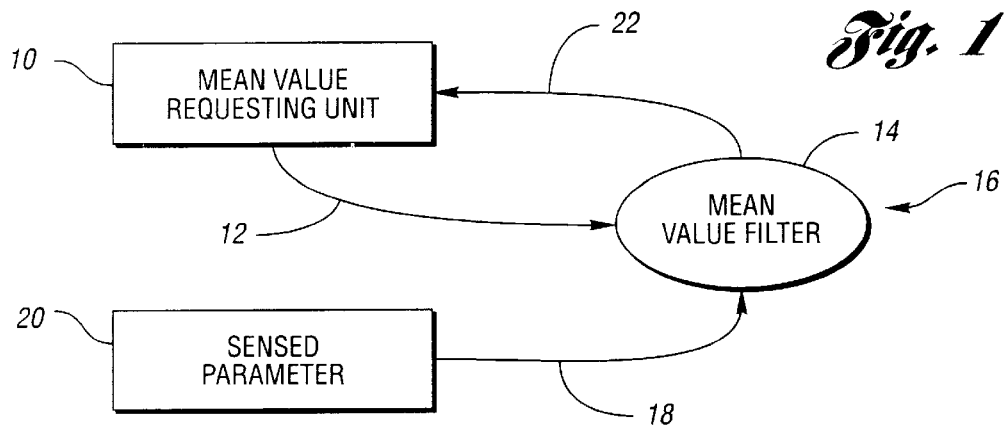
FIG. 1 is a context diagram of the present invention.

Referring now to FIG. 1, a diagram illustrating the context of the present invention is shown. Mean value filtering is commenced when mean value requesting unit 10 transmits a mean value request signal 12 to mean value filter 14. Mean value requesting unit 10 could be a software calling routine, an external input trigger, or the like. Mean value filter 14 is preferably a part of a sensor 16. Sensor 16 receives an input signal 18 indicative of a sensed parameter 20. Mean value filter 14 processes samples of input signal 18 to estimate the mean value of the input signal. Mean value filter 14 outputs a sensor signal 22 indicative of the estimated mean value of input signal 18 to mean value requesting unit 10.

Figure 2:
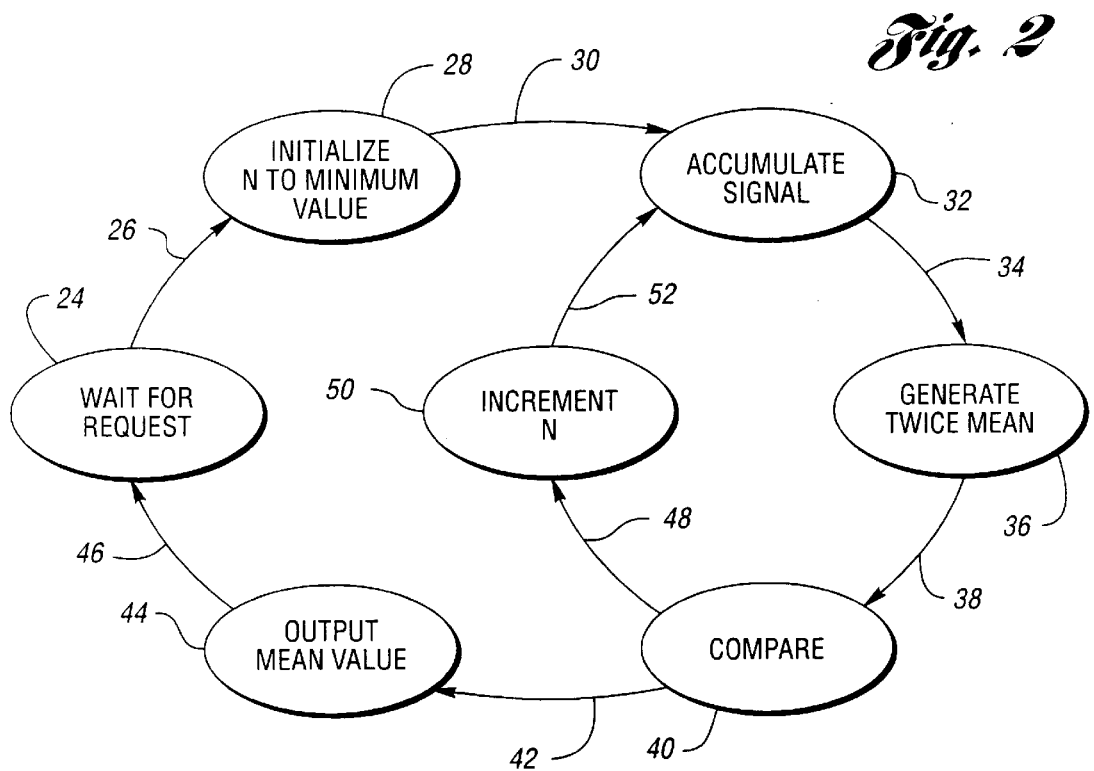
FIG. 2 is a state transition diagram illustrating the general sequence of operations performed for generating an estimated mean value of an input signal.

Referring now to FIG. 2, a state transition diagram illustrates the general sequence of operations performed by the method and system of the present invention for generating the estimated mean value of a signal. The state transition begins by waiting for a mean value request signal in state Wait for Request 24. Mean value request signal flow path 26 initiates a transition to state Initialize N to Minimum Value 28. N is a selected number of signal samples to be averaged. Preferably, N takes on the values of 2, 4, 8, 16, 32, . . . , etc. N ready signal flow path 30 initiates a transition, after N is selected, to state Accumulate Signal 32. State Accumulate Signal 32 generates a running sum of the N signal samples.

Operation remains in state Accumulate Signal 32 as each signal sample is added to the previous sum until the sum of the N signal samples is created. When the sum is complete, sum ready signal flow path 34 initiates a transition to state Generate Twice Mean 36. State Generate Twice Mean 36 generates a current twice mean value of the N signal samples. The current twice mean value is equal to the mean value of the last N/2 signal samples added to the mean value of the first N/2 signal samples. State Generate Twice Mean 36 also determines a previous twice mean value of the first N/2 signal samples. The previous twice mean value is equal to the mean value of the first N/2 signal samples multiplied by two.

After the current twice mean value is generated, twice mean ready signal flow path 38 causes a transition to state Compare 40. State Compare 40 compares the current twice mean value to the previous twice mean value to determine whether the estimated mean value has converged. The estimated mean value converges when the difference between the current and previous twice mean values is within a predetermined tolerance to a repeatable value. The estimated mean value is one-half of the current twice mean value. If the estimated mean value has converged, then agree signal flow path 42 causes a transition to state Output Mean Value 44. In state Output Mean Value 44, an estimated mean value output signal is outputted to mean value requesting unit 10. Subsequently, output done signal flow path 46 causes a transition back to state Wait for Request 24.

If the difference between current and previous twice mean values is not within the predetermined tolerance, then disagree signal flow path 48 causes a transition to state Increment N 50. State Increment N 50 increases the signal sample size by an increment which is a power of two. For example, if sixteen samples were analyzed in the previous cycle, state Increment N increases the sample size by two to thirty two. Then, incremented N signal flow path 52 causes a transition back to state Accumulate Signal 32. After resetting the sum of the previous samples to zero, state Accumulate Signal 32 generates a current sum of the last N/2 signal samples. In the example described above, after the current sum of the first sixteen signal samples was reset to zero, the last sixteen, i.e., the seventeenth to the thirty-second sample, would be summed to generate the current sum.

After state Accumulate Signal 32 generates the current sum, sum ready signal flow path 34 causes another transition to state Generate Twice Mean 36. Again state Generate Twice Mean 36 generates a current twice mean value of the N signal samples. In the example, the current twice mean value is equal to the mean value of the last sixteen signal samples added to the mean value of the first sixteen signal samples. The previous twice mean value is then equal to the mean value of the first sixteen signal samples multiplied by two. State Compare 40 then compares the current twice mean value to the previous twice mean value to determine whether their difference is within the predetermined tolerance. If not, operation continues again in state Increment N 52 and the closed loop between states 32, 36, 40, and 50 is repeated until the difference between the current and previous twice mean values is within the predetermined tolerance.

A feature of the present invention is that, because N is incremented by powers of two in state Increment N 50, the current sum generally includes twice as many signal samples as the prior sum. An exception to this is the first time that N is incremented. In this case the number of samples in the current sum is equal to the number of samples in the prior sum.

Using the example as an illustration of when the samples in the current and prior sums are equal, state Accumulate Signal 32 initially added the first N (sixteen) samples to generate a current sum. Then, after N was incremented by a power of two to thirty two, state Accumulate Signal 32 added the last sixteen samples to generate the new current sum. Thus, the first two sums each had sixteen samples. Now when N is incremented again by a power of two, N is now equal to sixty four, the last thirty two samples are added to generate a new current sum. Thirty two samples is twice as many as the sixteen samples in the previous sum. Subsequently, each time N is incremented, the number of samples in the current sum doubles the number of samples in the previous sum. Consequently, each update of the current twice mean value in state Generate Twice Mean 36 is generally an average of twice as many samples as the previous twice mean value.

A feature of the present invention is that state Generate Twice Mean 36, by using twice as many samples from the cycle before, provides a current twice mean value update which evenly weighs all of the samples, yet only uses one memory location (current twice mean value) to represent the prior samples. Thus, the sample size interval self-adapts or increases exponentially in powers of two, until the mean value of the first n samples agrees sufficiently with the mean value of the first 2n samples.

The sequence shown in FIG. 2 can be compactly stated as a series:

$$X(0) = \frac{\left\{0 + \Re\left(\left[\sum_{n=1}^{1} u_n\right]/1/4\right)\right\}}{2}$$

$$X(1) = \frac{\left\{X(0) + \Re\left(\left[\sum_{n=2}^{2} u_n\right]/1/2\right)\right\}}{2}$$

$$X(2) = \frac{\left\{X(1) + \Re\left(\left[\sum_{n=3}^{4} u_n\right]/1\right)\right\}}{2}$$

where:

$$X(3) = \frac{\left\{X(2) + \Re\left(\left[\sum_{n=5}^{8} u_n\right]/2\right)\right\}}{2}$$

$$X(k) = \frac{\left\{X(k-1) + \Re\left(\left[\sum_{n=2^{k-1}+1}^{2^k} u_n\right]/2^{k-2}\right)\right\}}{2}$$

X(k) is the current twice mean value of the first $2^k$ samples,

X(k−1) is the previous twice mean value of the first $2^{k-1}$ samples, $\Re$ is a rounding operator which rounds its argument to the finite precision arithmetic available in the target processor, and $u_n$ is the nth signal sample.

The current twice means value X(k) is then compared to the previous twice mean value X(k−1) to determine if their absolute difference is within the predetermined threshold. The following comparison is made:

|X(k)−X(k−1)|<Predetermined Threshold

If the absolute difference is within the predetermined threshold, then the estimated mean value is determined as one-half of the current twice mean value in accordance with the following equation:

$$\text{Estimated Mean Value} = \Re\left[\frac{X(k)}{2}\right]$$

Figure 3:
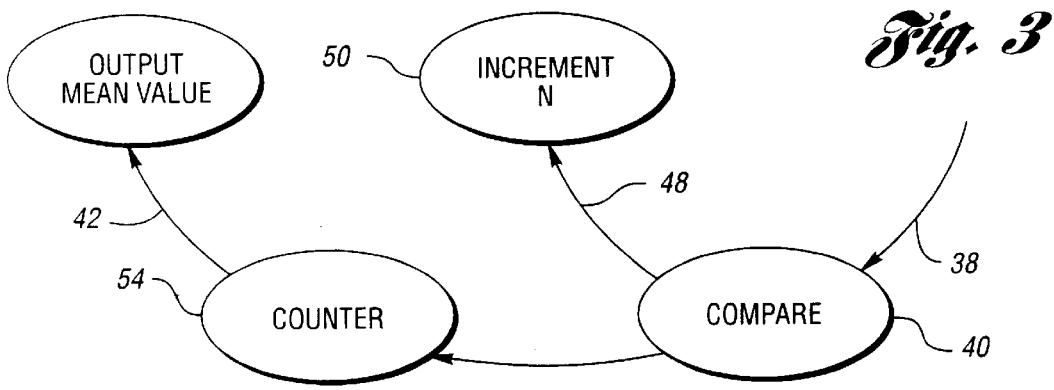
FIG. 3 is a modified version of part of the state transition diagram shown in FIG. 2.

Referring now to FIG. 3, the operation sequence performed by the method and system of the present invention may include a state Counter 54 interposed between states Compare 40, Output Mean Value 44, and Increment N 50 as shown in FIG. 3. State Counter 54 ensures that the mean value estimate has converged to a repeatable value.

In operation, state Counter 54 increments an acceptance counter by one after state Compare 40 determines that the difference between the current and previous twice mean values is within the predetermined tolerance. To ensure that a mean value output signal is not prematurely outputted, the difference between the current and previous twice mean values should fall within the predetermined tolerance a chosen number of consecutive cycles. Accordingly, state Counter 54 increments the acceptance counter by one each time the difference is within the predetermined tolerance during the respective cycle. After a chosen number of consecutive times that the difference falls within the predetermined tolerance, agree signal flow path 42 causes a transition from state Counter 54 to state Output Mean Value 44. Subsequently, a mean value output signal is outputted. State Counter 54 resets the acceptance counter to zero and starts the counting process anew each time the difference is not within the predetermined tolerance.

Figure 4B:
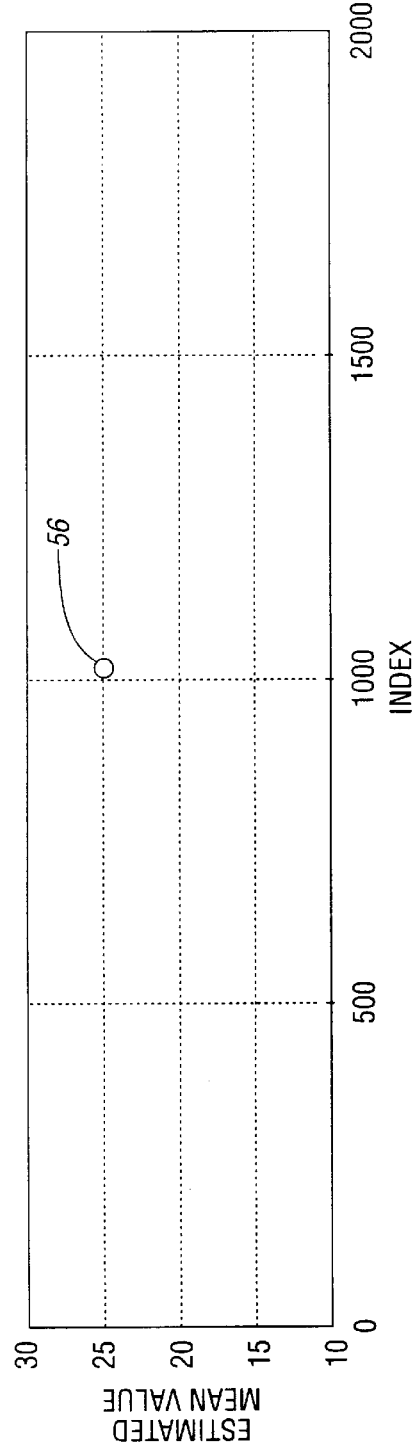

Referring now to FIGS. 4a–e, a series of plots exemplifying operation of the method and system of the present invention are shown. FIG. 4a is a plot of an example input signal, selected as:

Example Input Signal=25+15Y+10 sin (0.01 index)

where:

Y is a random number of normal distribution, with a mean of zero and a standard deviation of one, and index is the input data sample number.

Mean value request signal 12 is issued when index is zero. FIG. 4b is a plot of the current twice mean value as a function of the index. Note how the current twice mean value converges to fifty, twice the estimated mean value of twenty five, as the index gets larger.

Figure 4C:
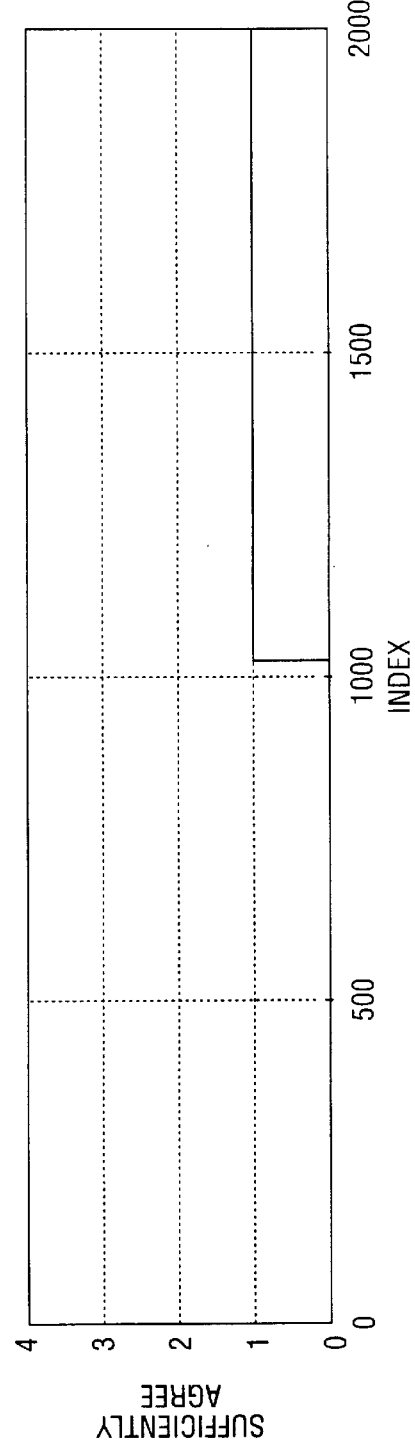
FIG. 4c is a plot of the value of an acceptance counter which increases when current and previous twice mean values are within a predetermined tolerance.

FIG. 4c is a plot of the acceptance counter as a function of the index. Note how the acceptance counter is reset to zero after initially incrementing to one. This happens because the difference between current and previous twice mean values falls outside of the predetermined tolerance after having been within the tolerance. The acceptance counter is shown corresponding to a chosen threshold of three consecutive times that the difference between the current and previous twice mean values is within the predetermined tolerance.

FIG. 4d is a plot indicating the estimated mean value of the input signal at point 56. The estimated mean value at point 56 is one-half of the current twice mean value at the corresponding index.

FIG. 4e is a plot indicating that successive updates of the current twice mean values are within the predetermined tolerance after the estimated mean value of the input signal has been determined.

A feature of the present invention is that the implementation of the series X(k) can be easily arranged to use only base 2 arithmetic. Thus, software using bit shifting instead of division can be provided. As known to those of ordinary skill in the art, bit shifting is a faster and less memory intensive operation than division.

Figure 5:
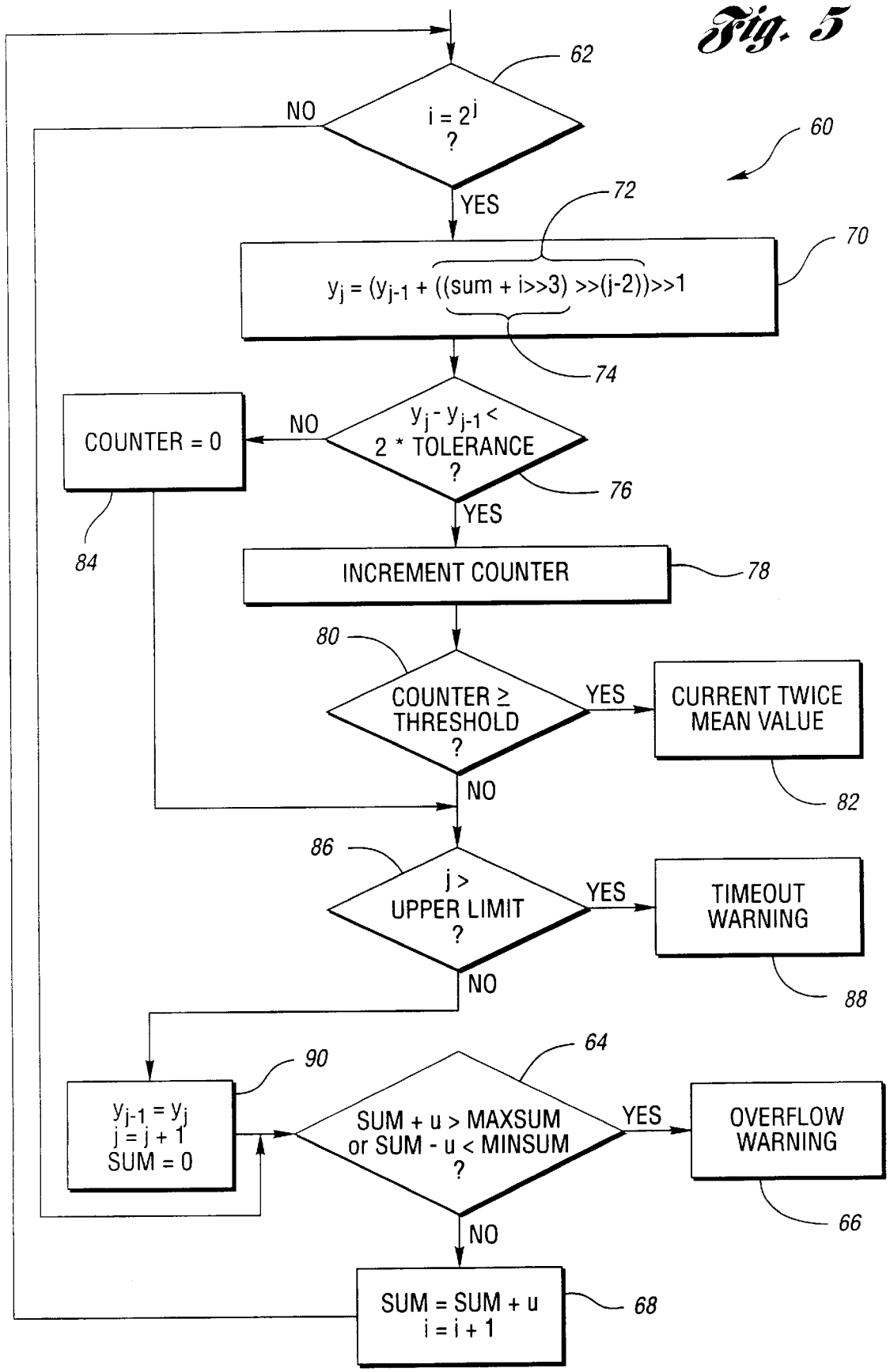
FIG. 5 is a flow diagram generally illustrating operation of a system or method according to the present invention.

Referring now to FIG. 5, a flow diagram 60 generally illustrating operation of a system or method according to the present invention is shown. As will be appreciated by one of ordinary skill in the art, flow diagram 60 represents control logic which may be implemented in hardware, software, or a combination of hardware and software. Preferably, the control logic is stored in a computer readable medium, such as PROM, EPROM, EEPROM, or flash memory, and represents program instructions which may be executed by a microprocessor. Of course, other implementations of the control logic using discrete components and/or custom integrated circuits, such as ASICs, are possible without departing from the spirit and scope of the present invention. One of ordinary skill in the art will also recognize that the particular order or sequence illustrated is not necessarily required to achieve the goals and objects of the present invention. Sequential operation of a system or method is shown for ease of illustration and description only. As such, various programming and processing strategies may be used, such as interrupt-driven processing, parallel processing, or the like, depending upon the particular application and implementation.

Flow diagram 60, which uses base 2 arithmetic, begins with decision block 62 determining whether i is equal to $2^j$ where i is the number of samples and j is the cycle. The variable i takes on the values of 2, 4, 8, 16, 32, . . . etc. If i is not equal to $2^j$, then decision block 62 branches to decision block 64. Decision block 64 determines whether the value u of the sample i added to the current sum is greater than a threshold value maxsum. Decision block 64 also determines whether the value u of the sample i subtracted from the current sum is lesser than a threshold value minsum. If either of these conditions exist then block 66 generates an overflow warning. If there is no overflow then decision block 64 branches off to block 68. In block 68, a current sum is determined by adding the value u of the sample i to the previous sum. Also, i is incremented by one. This process continues repeatedly until i is incremented enough times so that it is equal to $2^j$.

When i is equal to $2^j$, block 70 determines the current twice mean value $y_j$. Current twice mean value $y_j$ is equal to one-half of the summation of two terms, the first being the previous twice mean value $y_{j-1}$ and the second being a truncated sum term 72. As noted above, the previous twice mean value $y_{j-1}$ is equal to the mean value of the $2^{j-1}$ samples of the previous j–1 cycle multiplied by two. Truncated sum term 72 consists of a sum term 74, bit shifted to the right j–2 times. Sum term 74 is equal to the current sum added to the value i, bit shifted to the right three times. The previous twice mean value $y_{j-1}$ is added to truncated sum term 72. The result is then bit shifted to the right one time (to divide the result by two) as shown in block 70.

After determining $y_j$, decision block 76 determines whether the difference between current twice mean value $y_j$ and previous twice mean value $y_{j-1}$ is within a predetermined tolerance. If the difference is within the predetermined tolerance, then block 78 increments an acceptance counter. Then decision block 80 determines whether the value of the acceptance counter is greater than a count threshold. If so, then block 82 outputs a current twice mean value signal. The estimated mean value is determined by dividing the current twice mean value by two.

If decision block 76 determines that the difference between current twice mean value $y_j$ and previous twice mean value $y_{j-1}$ falls outside of the predetermined tolerance, then block 84 resets counter to zero. After the counter is reset to zero, or the value of the counter is less than the count threshold, decision block 86 determines whether j has reached an upper limit. If so, block 88 provides a timeout warning. If not, block 90 lets previous twice mean value $y_{j-1}$ be equal to current twice mean value $y_j$, increments j by one, and sets the sum to zero. Increasing j by one doubles the number of samples. After block 90 the above described process continues repeatedly until either of the conditions in decision blocks 80, 86, or 64 are met.

As shown, the advantages accruing to the present invention are numerous. The method and system of the present invention consume minimum memory space by utilizing a single state to represent the running average of all prior mean estimates without sacrificing accuracy of future estimates. The implementation is designed for rapid execution by assuming a fixed-point integer input signal representation. The implementation can update the mean estimate by the simple math operations of addition and bit-shifting rather than a more computationally burdensome division operation.

If desired, more complex comparisons between current and previous twice mean values may be performed. For instance, several prior twice mean values may be compared to each other and to the current twice mean value and then comparing the differences to a threshold for determining if the estimated mean value has converged.

The method and system of the present invention are deployable in a variety of automotive applications. For instance, in anti-lock brake system wheel size abnormality detection, powertrain diagnostics, analog pressure sensor bias washout, and the like.

While the best modes for carrying out the present invention have been described in detail, those familiar with the art to which this invention relates will recognize various alternative designs and embodiments for practicing the invention as defined by the following claims.

What is claimed is:

1. A sensor for generating an output signal indicative of an estimated mean value of a time varying input signal continuously responsive to a sensed parameter, the sensor comprising:

control logic operable for repeating the following,
sample the time varying input signal for N discrete (N=2, 4, 8, 16, . . . ) input signal samples;
determine a current twice mean value of the N input signal samples, wherein the current twice mean value is equal to the mean value of the last N/2 input signal samples added to the mean value of the first N/2 input signal samples;
compare the current twice mean value to a previous twice mean value of the first N/2 input signal samples, wherein the previous twice mean value is twice the mean value of the first N/2 input signal samples;
store the current twice mean value as the previous twice mean value; and
increment N by a power of two;
wherein the control logic is further operable to generate an output signal indicative of an estimate of the mean value of the input signal when the current twice mean value is within a predetermined tolerance of the previous twice mean value a consecutive number of times, wherein the estimate of the mean value is one-half of the current twice mean value.

2. The sensor of claim 1 wherein:
the generated output signal indicative of the estimated mean value of the input signal is provided to a system for bias washour.

3. The sensor of claim 1 wherein:
the generated output signal indicative of the estimated mean value of the input signal is provided to a digital filter for initialization of the digital filter.

4. The sensor of claim 1 wherein:
the generated output signal indicative of the estimated mean value of the input signal is provided to a diagnostic system to identify deterioration.

5. The sensor of claim 1 further comprising:
an acceptance counter which is incremented if the current twice mean value is within the predetermined tolerance of the previous twice mean value and is reset if the current twice mean value is outside of the predetermined tolerance of the previous twice mean value.

6. The sensor of claim 1 wherein:

the current twice mean value of the N input signal samples is determined by the formula $$X(k) = \frac{\left\{ X(k-1) + \Re\left(\left[\sum_{n=2^{k-1}+1}^{2^k} u_n\right]/2^{k-2}\right) \right\}}{2}$$

where:

$X(k)$ is the current twice mean value of the first $2^k$ samples, $X(k-1)$ is the previous twice mean value of the first $2_{k-1}$ samples, Z1 is a rounding operator which rounds its argument to the finite precision arithmetic available in the target processor, and $u_n$ is the nth signal sample.

* * * * *